United States Patent
Schimke et al.

(10) Patent No.: US 9,473,251 B2
(45) Date of Patent: Oct. 18, 2016

(54) TRANSFERRING AUDIO FILES (71) Applicant: HALLMARK CARDS, INCORPORATED, Kansas City, MO (US)

(72) Inventors: Scott A. Schimke, Leavenworth, KS (US); Nicholas Pedersen, Lawrence, KS (US); Kiersten Wilmes, Lawrence, KS (US); Max J. Younger, Roeland Park, KS (US); Ma Lap Man, Kowloon (HK)

(73) Assignee: HALLMARK CARDS, INCORPORATED, Kansas City, MO (US)

( * ) Notice: Subject to any disclaimer, the term of this patent is extended or adjusted under 35 U.S.C. 154(b) by 100 days.

(21) Appl. No.: 14/031,310

(22) Filed: Sep. 19, 2013

(65) Prior Publication Data
US 2015/0081282 A1 Mar. 19, 2015

(51) Int. Cl.
  *G10L 19/00* (2013.01)
  *H04B 11/00* (2006.01)
  *G11C 7/16* (2006.01)
  *G10L 19/02* (2013.01)

(52) U.S. Cl.
  CPC ............ *H04B 11/00* (2013.01); *G11C 7/16* (2013.01); *G10L 19/02* (2013.01); *G11C 2207/16* (2013.01)

(58) Field of Classification Search
  USPC .................. 704/201, 270, 203, 205
  See application file for complete search history.

(56) References Cited

U.S. PATENT DOCUMENTS

| | | | |
|---|---|---|---|
| 5,809,133 A | 9/1998 | Bartkowiak et al. | |
| 5,974,123 A | 10/1999 | Nakayama et al. | |
| 8,160,276 B2 | 4/2012 | Liao et al. | |
| 8,204,238 B2 | 6/2012 | Mozer | |
| 8,277,221 B2 | 10/2012 | Damron et al. | |
| 8,411,829 B2 | 4/2013 | Logan et al. | |
| 8,521,315 B2* | 8/2013 | Anderson et al. | 700/94 |
| 2002/0111808 A1* | 8/2002 | Feinberg | 704/270.1 |
| 2006/0270388 A1* | 11/2006 | Veeramachaneni | H04M 3/42382 455/412.1 |
| 2011/0106283 A1 | 5/2011 | Robinson | |
| 2011/0202346 A1* | 8/2011 | Meyer et al. | 704/260 |
| 2013/0010356 A1* | 1/2013 | Curtis et al. | 359/444 |

OTHER PUBLICATIONS

International Search Report with Written Opinion dated Dec. 29, 2014 in Application No. PCT/US2014/056593, 10 pages.
International Preliminary Report on Patentability dated Mar. 31, 2016 in Application No. PCT/US2014/056593, 7 pages.

* cited by examiner

*Primary Examiner* — Vu B Hang
(74) *Attorney, Agent, or Firm* — Shook, Hardy & Bacon L.L.P.

(57) ABSTRACT

Embodiments of the present invention use one or more audible tones to communicate metadata during a transfer of an audio file. Embodiments of the present invention communicate an audio file from a speaker in a recording device (e.g., a recordable book, toy, computing device) to a microphone in a receiving device. The audio file is transferred by audibly broadcasting the audio file content. The audio file may be a recording made by the user (e.g., the user singing a song, a child responding to a storybook prompt intended to elicit a response). The file transfer process uses one or more audible tones, such as dual-tone multi-frequency signaling ("DTMF") tones to communicate metadata associated with the audio file. Audible tones may also be used to communicate commands that delineate the beginning and/or end of a file broadcast.

20 Claims, 7 Drawing Sheets

TRANSFERRING AUDIO FILES

BACKGROUND

Toys and storybooks may include prompts meant to elicit an audible response from a user. The audible response is recorded and may be transferred to other devices via a USB cord or other wired connection.

SUMMARY

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

Embodiments of the present invention communicate an audio file from a speaker in a recording device (e.g., a recordable book, toy, computing device) to a microphone in a receiving device. The audio file is transferred by audibly broadcasting the audio file content. The audio file may be a recording made by the user (e.g., the user singing a song, a child responding to a storybook prompt intended to elicit a response). The file transfer process uses one or more audible tones to communicate metadata associated with the audio file. One or more audible tones may also be used to communicate commands that delineate the beginning and/or end of a file broadcast.

BRIEF DESCRIPTION OF THE DRAWINGS

Embodiments of the invention are described in detail below with reference to the attached drawing figures, wherein.

DETAILED DESCRIPTION

The subject matter of embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Embodiments of the present invention communicate an audio file from a speaker in a recording device (e.g., a recordable book, toy, computing device) to a microphone in a receiving device. The audio file is transferred by audibly broadcasting the audio file content. The audio file may be a recording made by the user (e.g., the user singing a song, a child responding to a prompt). The file transfer process uses one or more audible tones to communicate metadata associated with the audio file. One or more audible tones may also be used to communicate commands that delineate the beginning and/or end of a file broadcast.

Aspects of the present invention may encode metadata within audible tones using a proprietary protocol or an existing protocol. Existing protocols for communicating data using audible tones include dual-tone multi-frequency signaling ("DTMF"), phase-shift keying ("PSK"), quadrature-phase shift keying ("QPSK"), Frequency-shift keying ("FSK"), Quadrature amplitude modulation ("QAM"), and such. Throughout this disclosure DTMF is used in various examples, however, aspects of the invention are not limited to use of DTMF. Any protocol for encoding data within audible frequencies can work.

Aspects of the invention are limited to use with audible frequencies below about 20,000 Hz, for example less than about 10,000 Hz, or less than about 8,000 Hz, or less than about 5,000 Hz. Aspects of the invention are also limited to audible frequencies above 20 Hz, for example above 100 Hz, or above about 300 Hz. Using frequencies that are audible to humans allows aspects of the invention to use common microphones and speakers, which are typically optimized for operation in frequency ranges that are audible to humans.

In one embodiment, before transferring audio using DTMF tones, a receiving application is opened on the receiving device (e.g., a smartphone, tablet, or computer). Upon launching the application, the application may enter a "listen mode" in which the device monitors sounds received by the device's speakers to detect the audio file. Once the application is in "listen mode," the user triggers transfer of selected audio data on the recording device, which plays the audio data through its speaker(s). In particular, DTMF tones are initially communicated over-the-air through the recording device's speakers, the audio recording is communicated, and then one or more DTMF tones are communicated at the end of the audio recording.

Having briefly described an overview of embodiments of the invention, an exemplary operating environment suitable for use in implementing embodiments of the invention is described below.

EXEMPLARY OPERATING ENVIRONMENT

Figure 1:
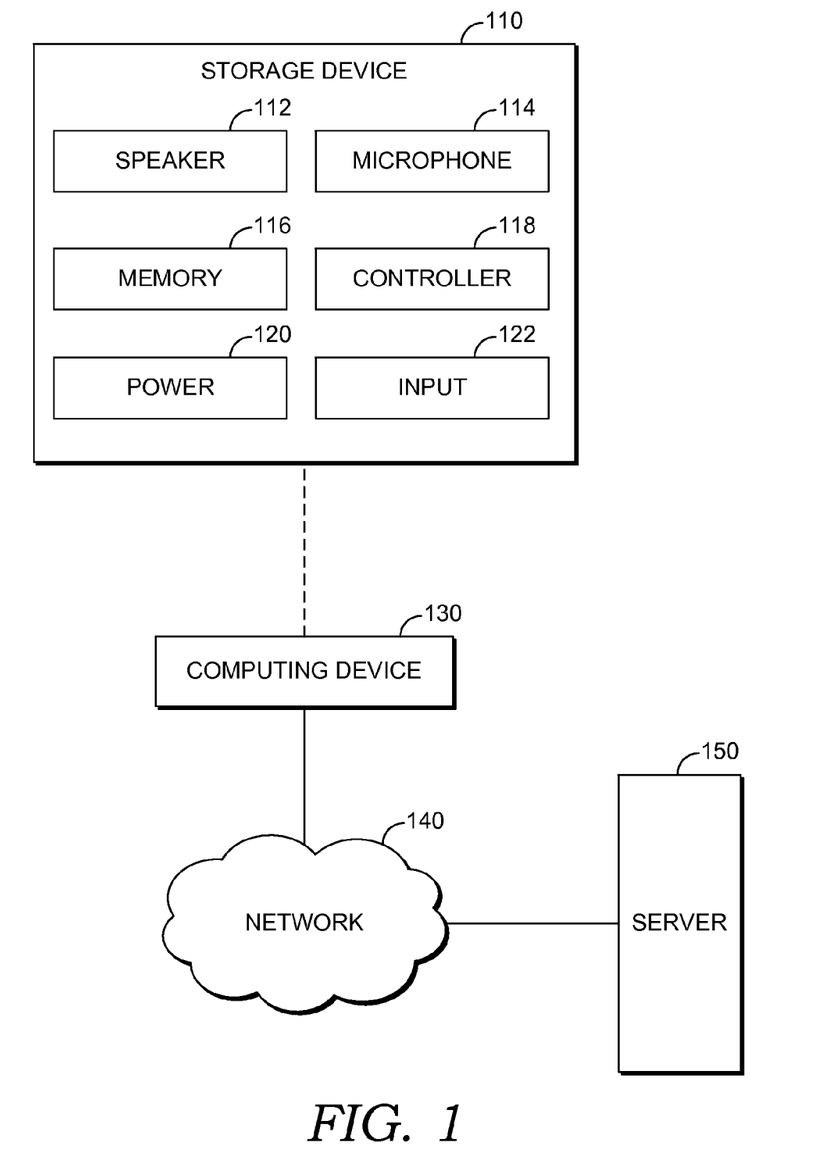
FIG. 1 is a block diagram of an exemplary computing environment suitable for implementing embodiments of the invention.

Turning now to FIG. 1, an exemplary computing environment 100 is shown, in accordance with an embodiment of the present invention. The computing environment 100 includes a storage device 110, a computing device 130, a network 140, and a remote server 150. The computing device 130 is connected to the server 150 through network 140. The network 140 may be a wide area network, such as the Internet. The computing system environment 100 shown in FIG. 1 is merely an example of one suitable computing system environment and is not intended to suggest any limitation as to the scope of use or functionality of embodiments of the present invention. Neither should the computing system environment 100 be interpreted as having any dependency or requirement related to any single module/component or combination of modules/components illustrated therein.

The server 150 may provide a storage service for users. The storage service may store audio recordings, images, and other content for the user to retrieve when convenient. The service provided by the server 150 may be associated with one or more storage devices that prompt users to respond to a question. The response to the prompt may be recorded and stored in an audio file.

The storage device 110 comprises an audio speaker 112, a microphone 114, computer memory 116, a controller 118, a power supply 120, and an input mechanism 122. The storage device 110 may take the form of a toy, a recordable storybook, or some other computing device capable of recording audio, storing audio files, and transferring audio files to another device. In one aspect, the storage device 110 is not physically coupled to the computing device 130. For example, the storage device 110 is not connected to the computing device with a USB cable. In another aspect, the storage device 110 is not communicatively coupled to the computing device over a wireless connection, such as those that enable Bluetooth or Wi-FI. Both the storage device 110 and computing device 130 may be capable of wireless or wired communications, but such functionality is not used during the file transfer method used in embodiments of the invention. Embodiments of the invention transfer audio files between devices using the microphone of one device and the speaker of the other device without additional communications through other channels.

In embodiments, storage devices may include multiple speakers. The speaker 112 is used to communicate audio files and associated metadata to another device. The speaker 112 may also be used to provide an audible prompt to which a user responds. For example, the prompt could ask a child what they want for Christmas. The child's response could be recorded in an audio file.

The microphone 114 may be used to record a user's response to a prompt. The memory 116 is used to record audio files, which record sounds captured by the microphone 114. The memory 116 may also store computer instructions that enable file transfers and otherwise enable operation of the storage device. The memory 116 may include an encoding table used to encode metadata in a DTMF format. The table may associate different DTMF tones with different letters in the alphabet, different numbers, or other symbols.

The controller 118 may be a computer processor or other hardware and software capable of controlling the storage device 110. The controller 118 may access or run programs stored in the memory 116. The controller 118 may respond to user inputs and generate outputs in response.

The power supply 120 may be a battery, AC supply, DC supply, or other suitable power supply for the storage device.

The input 122 may be a button, sensor, accelerometer, gyroscope, or other mechanism for receiving input from a user. For example, shaking the storage device or holding the storage device in a particular orientation (e.g., upside down, at a 45-degree angle) may activate a recording function or trigger a prompt. The input may trigger a prompt or place the storage device 110 in a recording mode. The storage device 110 may include multiple input sensors 112. For example, a recordable storybook may have sensors that detect the page to which the book is open. A different prompt may be associated with each different page and the resulting recording may also be associated with the page or prompt that elicited the recorded response. The storage device 110 may include a first input for generating a prompt and a second input used to initiate a file transfer. Upon selection of a file transfer input, the storage device 110 will play a selected audible recording along with metadata encoded in DTMF format. The metadata describes the audible recording. The file transfer process will be described in more detail subsequently.

The invention may be described in the general context of computer code or machine-useable instructions, including computer-executable instructions such as program components, being executed by a computer or other machine, such as a personal data assistant or other handheld device. Generally, program components, including routines, programs, objects, components, data structures, and the like, refer to code that performs particular tasks or implements particular abstract data types. Embodiments of the invention may be practiced in a variety of system configurations, including handheld devices, consumer electronics, general-purpose computers, specialty computing devices, etc. Embodiments of the invention may also be practiced in distributed computing environments where tasks are performed by remote-processing devices that are linked through a communications network.

Storage device 100 and computing device 130 typically include a variety of computer-readable media. Computer-readable media can be any available media that can be accessed by a computing device and includes both volatile and nonvolatile media, removable and non-removable media. By way of example, and not limitation, computer-readable media may comprise computer storage media and communication media. Computer-storage media includes both volatile and nonvolatile, removable and non-removable media implemented in any method or technology for storage of information such as computer-readable instructions, data structures, program modules or other data.

Computer storage media includes RAM, ROM, EEPROM, flash memory or other memory technology, CD-ROM, digital versatile disks (DVD) or other optical disk storage, magnetic cassettes, magnetic tape, magnetic disk storage or other magnetic storage devices. Computer storage media does not comprise a propagated data signal or other forms of communication media.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Although the various blocks of FIG. 1 are shown with lines for the sake of clarity, in reality, delineating various components is not so clear, and metaphorically, the lines would more accurately be grey and fuzzy. For example, processors have memory. The inventors hereof recognize that such is the nature of the art, and reiterate that the diagram of FIG. 1 is merely illustrative of an exemplary computing device that can be used in connection with one or more embodiments of the invention. Distinction is not made between such categories as "workstation," "server," "laptop," "handheld device," etc., as all are contemplated within the scope of FIG. 1 and refer to "computer" or "computing device."

Figure 2:
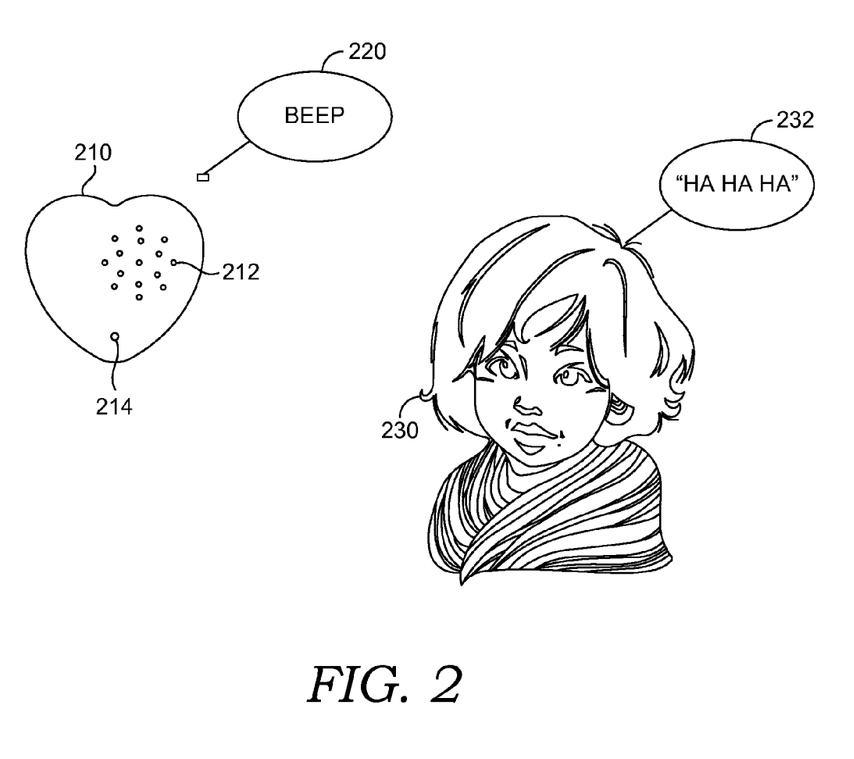
FIG. 2 is a diagram of a storage device recording a user's response to a prompt, in accordance with an embodiment of the present invention.

Turning now to FIG. 2, a prompting scenario is illustrated, in accordance with an embodiment of the present invention. As mentioned, embodiments of the present invention may be used to transfer files from storage devices that are intended to capture a child's voice or other user input. In this case, the storage device is a heart-shaped toy 210. The toy 210 includes a speaker 212 and a microphone 214. The storage device 210 may be similar to the storage device 110 described previously with reference to FIG. 1.

In response to an input (not shown), the storage device 210 may issue an audible prompt. In the example shown, the audible prompt 220 is a beep indicating that the storage device 210 is in record mode. In response, the child 230 says "ha ha ha" 232. The "ha ha ha" 232 may be recorded and saved in an audio file on the storage device 210. The audible file may then be transferred to a computing device as shown in FIG. 3.

Figure 3:
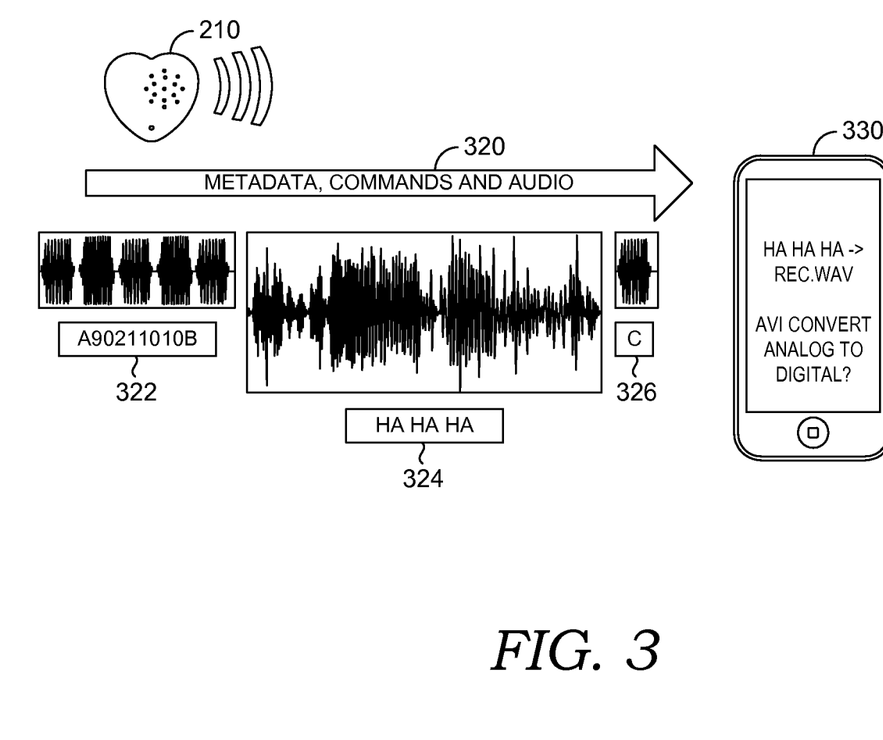
FIG. 3 is a diagram of a toy transferring an audio file to a smartphone, in accordance with an embodiment of the present invention.

Turning now to FIG. 3, the transfer of metadata, commands, and audio from a storage device to computing device is shown, in accordance with an embodiment of the present invention. The storage device 210 has been described previously with reference to FIG. 2. Computing device 330 is depicted as a smartphone. Embodiments of the present invention are not limited for use with a smartphone. Prior to instructing the storage device 210 to communicate or transfer the audio file, an application for receiving the audio file may be opened on the computing device 330. Once opened, the application may be put into listening mode. In the listening mode, the receiving application monitors inputs received by a microphone on the computing device 330. Specifically, the receiving application may listen for frequencies associated with DTMF communications. Table 1 below shows the frequencies used to generate a tone corresponding to an input. For example, a combination of the 1209 Hz tone and 770 Hz tone corresponds to "4."

TABLE 1

|  | 1209 Hz | 1336 Hz | 1477 Hz | 1633 Hz |
|---|---|---|---|---|
| 697 Hz | 1 | 2 | 3 | A |
| 770 Hz | 4 | 5 | 6 | B |
| 852 Hz | 7 | 8 | 9 | C |
| 941 Hz | * | 0 | # | D |

Metadata, commands, and audio 320 are broadcast from a speaker in the storage device 210 and received by a microphone in the computing device 330. The metadata 322 is preceded by a DTMF tone corresponding to the "A" and followed by a DTMF tone corresponding to the letter "B." The metadata itself is a series of numbers. In the example shown, the metadata is the number "90211010." The metadata may describe different features of the associated audio file. For example, a series of digits may identify a device. Another series of numbers within the metadata may identify a prompt associated with the audio file. The method may include a check digit that helps confirm the metadata was accurately interpreted by the receiving device. If the check digit is not matched, the user may be informed that an error has occurred and be asked to reinitiate transmission of the audio file.

After playing the metadata 322, the audio file 324 is played. A DTMF tone 326 corresponding to the "C" marks the end of the audio transmission. The computing device 330 may store the audio file locally and/or communicate the audio file to a remote storage service. Whether stored locally or remotely, the computing device 330 may translate the DTMF encoded metadata to another form and associate the metadata with appropriate data fields associated with the newly received audio file.

Figure 4:
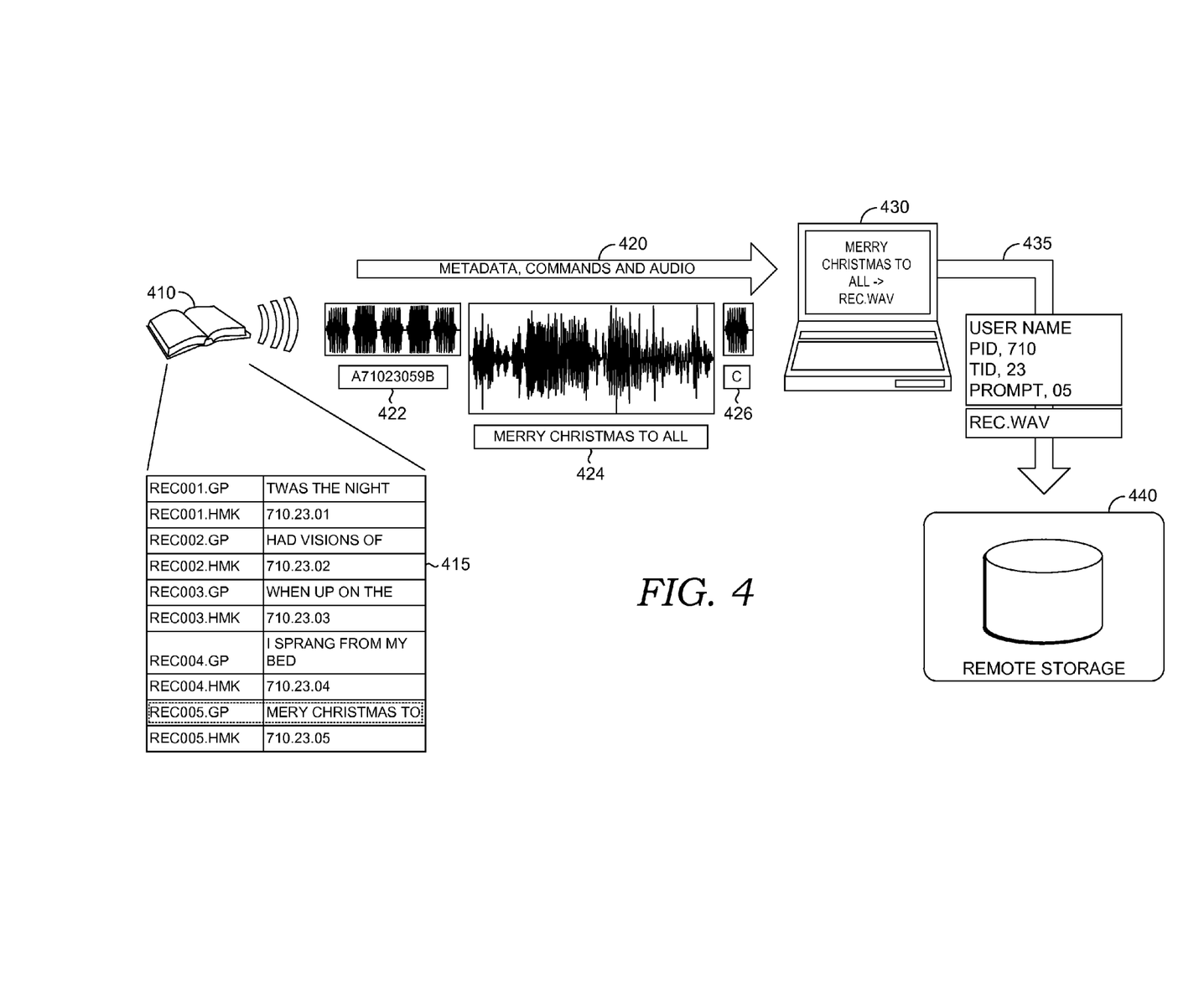
FIG. 4 is a diagram of a recordable story book transferring an audio file to a laptop computer, in accordance with an embodiment of the present invention.

Turning now to FIG. 4, transferring one of several audio files 420 stored in recordable storybook 410 to a computing device 430, and then to a remote storage 440 is illustrated, in accordance with an embodiment of the present invention. The recordable storybook 410 records a user reading a story. Each part of the story may be saved as a separate audio file. For example, each phrase may be saved as a separate audio file.

The table 415 shows five different recordings stored within audio files. Each audio file is associated with a metadata file. For example, the RDC005.GP file stores a recording of a user stating, "Merry Christmas to all." This file is associated with a metadata file by the same name (i.e., RDC005.HMK) but with a different extension that comprises the numbers "710.23.05." The other files are associated with different metadata. The metadata may identify a device, a prompt, a story, or other information.

As described previously with reference to FIG. 3, the metadata 422 is broadcast through a speaker in the recordable storybook 410. The metadata 422 is preceded by a DTMF tone associated with the letter "A." The metadata 422 is followed by the DTMF tone "B." the films associated with the letters A and B signal the beginning and the end of the metadata transmission. The content of the audio file is audibly broadcast from the recordable storybook 410. A DTMF tone corresponding to the "C" marks the end of the transmission.

The computing device 430, depicted as a laptop, receives the metadata, the command signals, and the audio content of the audio file. The computing device 430 translates the DTMF signals into the values associated with the signals and generates metadata. The metadata is then associated with a newly created audio file that stores a recording of the user saying "Merry Christmas to all." The computing device 430 communicates 435 the newly created audio file and associated metadata to a remote storage device 440. The remote storage device may save the audio file and metadata for later retrieval by the user. A local copy of the audio file and metadata may also be maintained in computing device 430.

Figure 5:
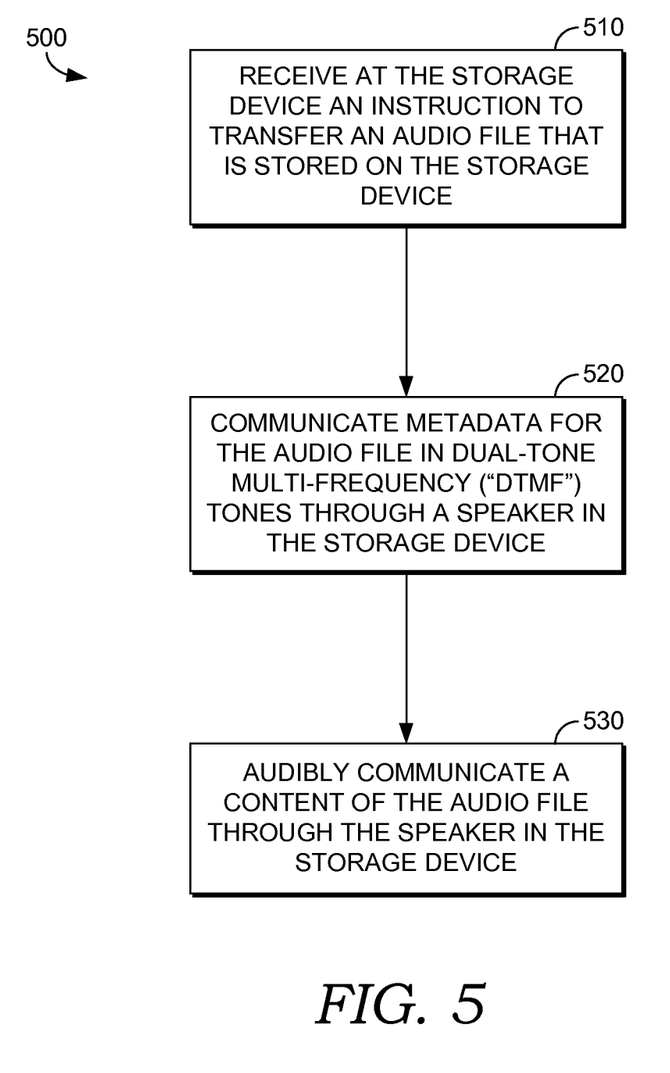
FIG. 5 is a flow chart showing a method of transferring an audio file from a storage device to a computing device, in accordance with an embodiment of the present invention.

Turning now to FIG. 5, a method 500 of transferring an audio file from a storage device to computing device is shown, in accordance with an embodiment of the present invention. At step 510, the storage device receives an instruction to transfer an audio file that is stored on the storage device. The instruction may be provided by a user pushing a button on the storage device or through some other mechanism. As mentioned, the audio file may include audio content generated by recording a user's voice. The user may speak in response to a prompt asking the user for particular information or simply indicating that the storage devices in record mode. The recording may be stored with metadata describing the prompt that elicited the recorded response.

In one embodiment, only a single audio file is stored on the storage device. Alternatively, multiple audio files may be stored on the storage device. When multiple files are stored, an algorithm may be followed to determine which of the multiple files to transfer. The algorithm may select the most recently created audio file, the longest audio file, the oldest audio file, or use some other criteria. In one embodiment, all stored files are transferred individually and then deleted upon transmission. A user may need to confirm that the recording should be deleted after the computing device has received file.

At step 520, the audio file's metadata, which has been encoded in dual-tone multi-frequency tones, is communicated through a speaker in the storage device. The encoded metadata may be bracketed by a DTMF tone at the beginning and a different DTMF tone at the end. The tone at the beginning and end are used to identify the start and end of the metadata. In one embodiment, the tones used at beginning and end of the are reserved for that purpose and the tones may not be used within the metadata transmission. The encoded metadata may include numbers, letters, and symbols.

At step 530, the audio file's content is audibly communicated through the speaker in the storage device. Essentially, the storage device plays the audio file through the speaker. The audio file may be played at a volume that is audible to humans. The audio file content is recorded by a receiving device and used to create a new file on the receiving device.

Figure 6:
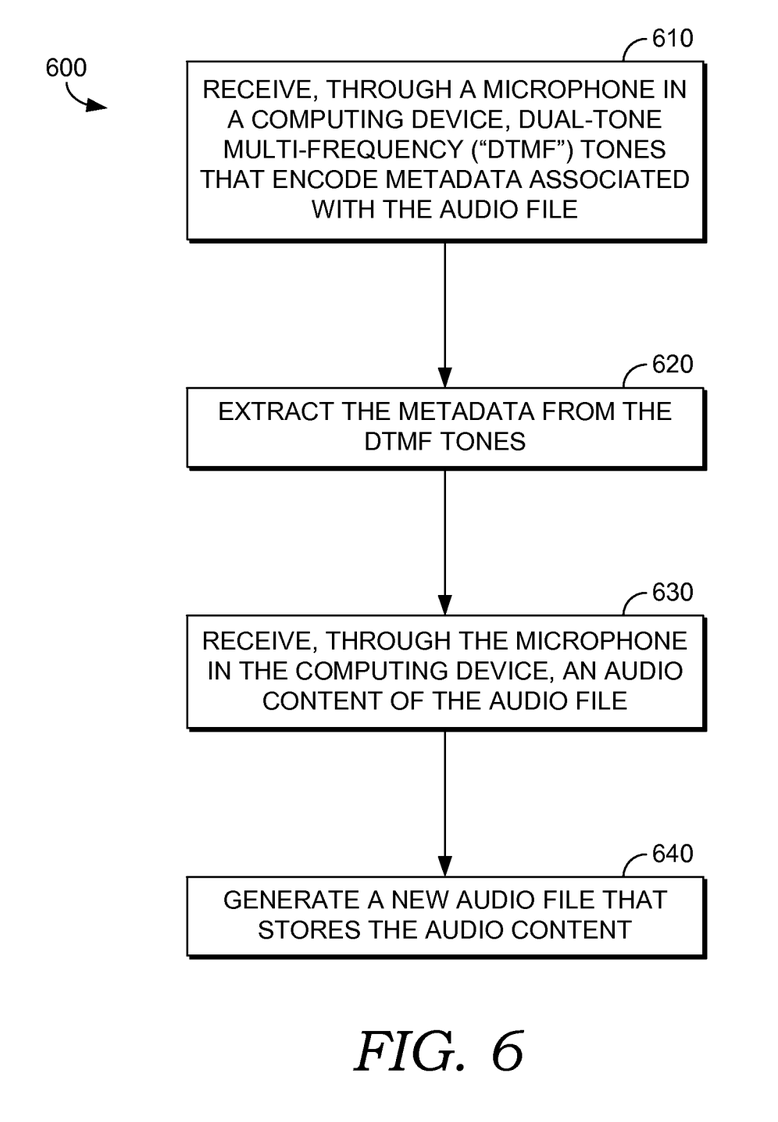
FIG. 6 is a flow chart showing a method of receiving an audio file from a storage device, in accordance with an embodiment of the present invention.

Turning now to FIG. 6, a method 600 of receiving an audio file from a storage device is shown, in accordance with an embodiment of the present invention. At step 610, dual-tone multi-frequency tones that encode metadata associated with the audio file are received through a microphone in a computing device. As mentioned, the computing device could be a smart phone, tablet, laptop computer, smart TV, or similar.

At step 620, the metadata is extracted from the DTMF tones. Each DTMF tone comprises two tones having different frequencies. The combined tone is analyzed and matched with a number, letter, or symbol that corresponds to the dual tones. As part of the extraction, each tone is used to identify the corresponding letter, number, or symbol. In addition to receiving metadata, command strings that bracket the metadata or indicate the beginning or end of the audio transmission may be received. The command strings may be excluded from the metadata and discarded.

At step 630, the audio file's audio content is received through the microphone in the computing device. At step 640, a new audio file that stores the audio content is generated. The audio file may be saved on the computing device. Alternatively or additionally, the new audio file may be transferred to a remote storage service. The metadata extracted from the DTMF tones may be associated with the newly created audio file whether stored locally or remotely. The sound of the DTMF tones may be excluded from the audio content received at step 630. In other words, the transferred audio content may be played from the computing device without broadcasting any of the DTMF tones.

Figure 7:
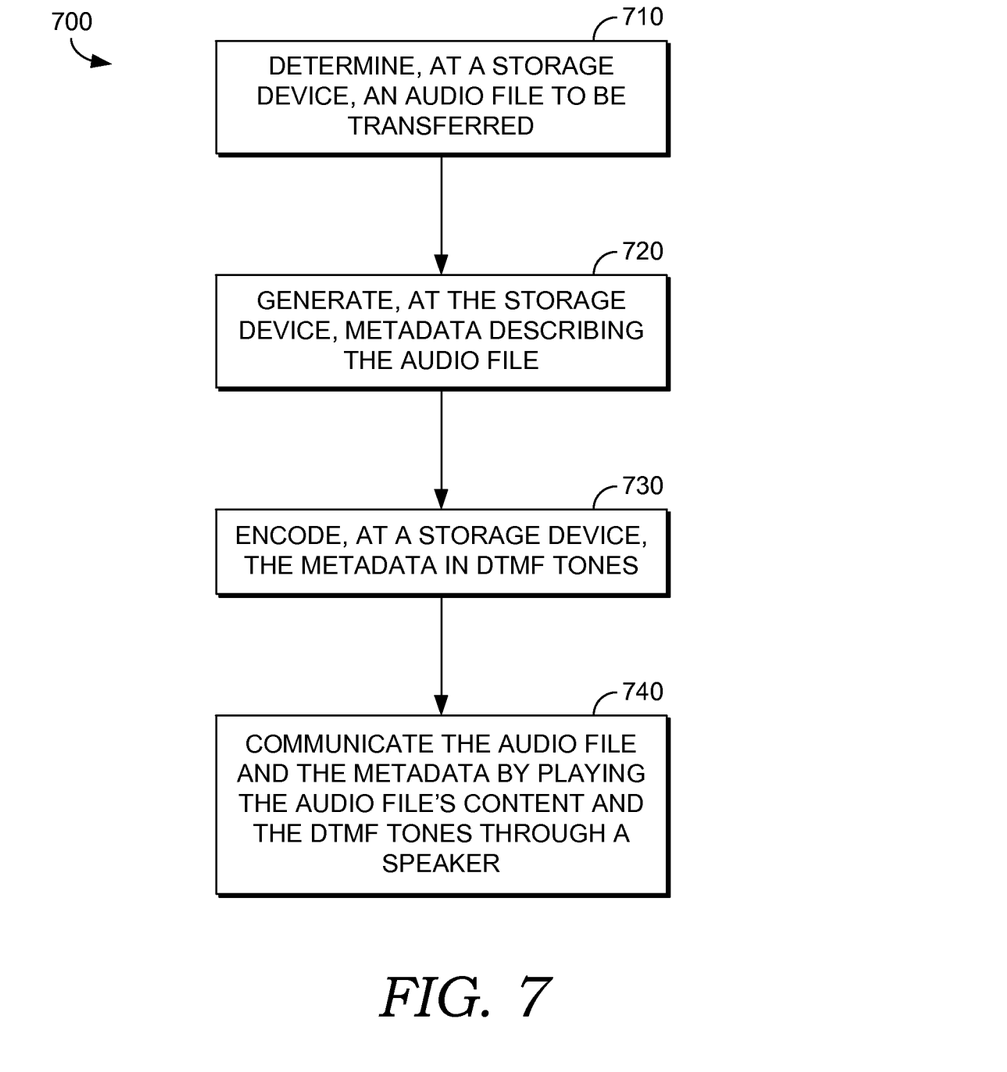
FIG. 7 is a flow chart showing a method of transferring an audio file with metadata that is encoded in one or more audible tones, in accordance with an embodiment of the present invention.

Turning now to FIG. 7, a method 700 of transferring an audio file with metadata that is encoded in ("DTMF") tones is provided, in accordance with an embodiment of the present invention. At step 710, an audio file that is to be transferred is determined at a storage device. In other words, one of several audio files stored on the storage device is selected for transfer. The determination may involve user input or selection of the audio file.

At step 720, metadata describing the audio file is generated at the storage device. The metadata may identify the storage device, a user, a prompt associated with the audio recording, or other information. The metadata may comprise numbers, letters, and symbols that may be represented in DTMF tones, including A, B, C, D, #, *, 1, 2, 3, 4, 5, 6, 7, 8, 9, 0.

At step 730, the metadata is encoded into DTMF tones at the storage device. At step 740, the audio file in the metadata are communicated by playing the audio file's content and the DTMF tones through a speaker in the storage device. A receiving device may save a new file is associated with the metadata and includes the audio content.

Embodiments of the invention have been described to be illustrative rather than restrictive. It will be understood that certain features and subcombinations are of utility and may be employed without reference to other features and subcombinations. This is contemplated by and is within the scope of the claims.

The invention claimed is:

1. A method of transferring an audio file from a storage device to a computing device, the method comprising:
   receiving at the storage device an instruction to transfer an audio file that is stored on the storage device;
   generating metadata for the audio file in encoded audible tones through a speaker in the storage device, wherein the metadata describes the audio file, the audible tones have frequencies between 20 and 20,000 Hz, and each of the encoded audible tones corresponds to a letter, number or symbol of the metadata; and
   transferring the audio file by audibly communicating a content of the audio file through the speaker in the storage device after communication of the encoded audible tones through the speaker.

2. The method of claim 1, wherein the method further comprises communicating a command string in one or more audible tones through the speaker in the storage device before or after communicating the content.

3. The method of claim 2, wherein the command string indicates communication of the content has ended, and wherein the command string is communicated directly after the content is communicated.

4. The method of claim 2, wherein the command string indicates communication of the content is about begin, and wherein the command string is communicated directly before the content is communicated.

5. The method of claim 2, wherein the command string includes a check digit for the metadata.

6. The method of claim 1, wherein the storage device stores multiple audio files and the audio file is the last one recorded.

7. The method of claim 1, wherein the storage device includes recording capabilities, and wherein the method further comprises recording a user's response to a prompt communicated by the storage device.

8. A method of receiving an audio file from a storage device, the method comprising:
   receiving, through a microphone in a computing device, one or more encoded audible tones that encode metadata describing the audio file, wherein each of the encoded audible tones corresponds to a letter, number or symbol of the metadata;
   extracting the metadata from the one or more encoded audible tones;
   receiving, through the microphone in the computing device, an audio content of the audio file after receipt of the one or more encoded audible tones;
   generating a new audio file that stores the audio content.

9. The method of claim 8, wherein the method further comprises receiving, through the microphone in the computing device, a one or more audible tones corresponding to a command immediately before or immediately after the audio content.

10. The method of claim 8, wherein the method further comprises not recording the one or more encoded audible tones in the new audio file.

11. The method of claim 8, wherein the method further comprises automatically transferring the new audio file over a wide area network to a remote storage service.

12. The method of claim 8, wherein the method further comprises receiving an instruction to enter a listening mode.

13. The method of claim 8, wherein the metadata describes identification information for a storage device that communicated with metadata and the audio content.

14. The method of claim 8, wherein the metadata describes a prompt that asks a user to respond with the audio content.

15. One or more non-transitory computer-storage media having computer executable instructions embodied thereon that when executed by a computing device performs a method of transferring an audio file with metadata that is encoded in one or more audible tones, the method comprising:

determining, at a storage device, an audio file to be transferred;

generating, at the storage device, metadata describing the audio file;

encoding, at a storage device, the metadata in one or more encoded audible tones, wherein each of the encoded audible tones corresponds to a letter, number or symbol of the metadata; and     transferring the audio file by communicating the audio file and the metadata by playing the one or more encoded audible tones and then the audio file's content through a speaker.

16. The method of claim 15, wherein the storage device is a recordable story book.

17. The media of claim 15, wherein the storage device is a toy.

18. The media of claim 15, wherein said determining, at the storage device, an audio file to be transferred comprises determining that the audio file has been recorded more recently than other audio files on the storage device.

19. The media of claim 15, wherein the method further comprises communicating one or more audible tones that marks an end of the audio file's content after playing the audio file's content.

20. The media of claim 15, wherein the method further comprises receiving a request to transfer an audio file.

* * * * *